United States Patent [19]

Casperson et al.

[11] Patent Number: 5,402,313

[45] Date of Patent: Mar. 28, 1995

[54] ELECTRONIC COMPONENT HEAT SINK ATTACHMENT USING A CANTED COIL SPRING

[75] Inventors: Paul G. Casperson; Michael Durbin, both of Columbus, Ind.

[73] Assignee: Cummins Engine Company, Inc., Columbus, Ind.

[21] Appl. No.: 64,643

[22] Filed: May 21, 1993

[51] Int. Cl.6 ............................................. H05K 7/20
[52] U.S. Cl. .................. 361/710; 174/16.3; 257/726; 257/719; 165/185
[58] Field of Search .............................. 165/80.3, 185; 176/16.3; 361/383, 386–389; 257/718, 719, 726, 727

[56] References Cited

U.S. PATENT DOCUMENTS 4,993,482  2/1991  Dolbear et al. .

FOREIGN PATENT DOCUMENTS 0111709  6/1984  European Pat. Off. .
0281796  11/1990  Japan .................... 361/386
2146423  4/1985  United Kingdom .

Primary Examiner—Gregory D. Thompson
Attorney, Agent, or Firm—Sixbey, Friedman, Leedom & Ferguson

[57] ABSTRACT

A thermal attachment assembly for heat generating electronic devices which uses a canted coil spring to apply pressure directly against electronic components. The attachment assembly includes a heat sink housing in which the electronic components are pressed against an electrically insulating, thermally conductive film positioned against a surface of a shoulder or side wall of the heat sink housing. The force of the canted coil spring can be counterbalanced by a cover for the housing, or by an abutment that is either fixed in the housing or floats between attachment and an assembly at each of opposite sides of the housing.

18 Claims, 3 Drawing Sheets

ELECTRONIC COMPONENT HEAT SINK ATTACHMENT USING A CANTED COIL SPRING

BACKGROUND OF THE INVENTION

1. Field of the Invention

This invention relates to the attachment of printed circuit board-mounted, heat generating electrical components to heat sinks. In particular, to the attachment of such electrical components which have heat transfer tabs to heat sink housings using spring type members.

2. Description of Related Art

One method by which tabbed printed circuit board-mounted, heat generating electrical components have been attached to heat sinks has involved individually attaching each device to the heat sink with a screw through the hole in the tab of the electronic device, and utilizing an electrically insulating thermally conductive film between the heat sink and the device tab. A nut is tightened onto the screw to provide the compressive force required to provide adequate compression of the film to maximize heat transfer from the device to the heat sink through the film. There are many variations of this technique, such as using a threaded hole in the heat sink rather than a nut. Problems arise with this general manner of attachment because the tension created by the screw may be relieved by material creep in the insulating washer or grommet, or the screw may back out under certain operating conditions, such as where the device is subject to vibration or temperature cycling. Another disadvantage is that the large number of parts that must be manually assembled when there are a number of heat generating components in an assembly, and it is difficult to automate the production of such attachments for high volume manufacturing.

In addition to the various uses of attachment screws, numerous attachment techniques have been developed which use spring members. A number of these attachments use clips with multiple spring fingers, as can be seen by reference to U.S. Pat. Nos. 4,922,601; 4,891,735; 4,872,089; 4,845,590; 4,707,726; 4,674,005; 4,605,986; and 4,479,140, for example. Difficulties are encountered with these techniques for various reasons. To achieve a compact assembly, the springs must achieve high forces at low deflections, and this means that the springs must be manufactured specifically for an individual device and changing the device may cause the spring to exert too much or too little force since stiff springs have force constants which create a very narrow range of deflections within which the proper pressure will be applied. Furthermore, there is often a need for special tools to insure that the device or the spring is not damaged during assembly. Historically, electrically insulating and thermally conductive pads require 300–500 psi for effective heat transfer; but, this requires a material to be disposed between the spring and the device to distribute the spring force on the device to prevent the spring from damaging the device. Some arrangements require that the heat sink be a separate part from the housing, and others require numerous unique parts that need to be manually assembled.

Canted coil springs have the attribute that, unlike conventional springs which apply a force which varies as a function of deflection, they apply an essentially constant force over a large deflection range. This type of spring is well known for use in electronic devices. Most commonly, they are utilized as a means to hold a printed circuit board in place in proper alignment. In this regard, reference can be made to U.S. Pat. Nos. 5,092,781 and 5,069,627, as well as to page 3.1B-2 of Bat Seal Engineering Company catalog no. LE-44D.

Additionally, canted springs are known for use as electrical and thermal conductors. For example, in U.S. Pat. No. 4,993,482, a thermally conductive, canted coil spring is used to provide a low force, thermal path between heat generating electronic components and a heat sink in close proximity. In this arrangement, the spring is flattened to increase the contact between the canted spring and the components and heat sink and thereby decrease the thermal resistance.

Thus, there is a need for a heat sink attachment which will enable the use of low force springs in order to increase the range of permissible spring deflections, thereby increasing the tolerances and the variety of heat sinks which may be attached, and to eliminate the need for intervening materials for distributing the spring force. Additionally, a need also exists for an arrangement which will not require numerous parts that require manual assembly.

SUMMARY OF THE INVENTION

In keeping with the foregoing, primary objects of the present invention involve the provision of an attachment between numerous types of power generating electrical devices and a housing which also serves as a heat sink while:
- minimizing the number of parts required;
- facilitating manual or automated assembly;
- achieving a minimal packaged volume; and
- accepting of parts with a greater degree of dimensional tolerance.

These and other objects of the present invention are achieved by a thermal attachment assembly for heat generating electronic devices which includes a canted coil spring that directly presses on electronic components to hold them against a heat sink. In accordance with preferred embodiments, the compressive force can be applied to the spring via a cover for a housing serving as the heat sink or by an abutment that is mounted in the housing. One or more canted springs are attached to the cover or the abutment and act on one or more electrical components that are carried on a circuit board and have had their leads bent to minimize stresses.

These and further objects, features and advantages of the present invention will become apparent from the following description when taken in connection with the accompanying drawings which, for purposes of illustration only, show several embodiments in accordance with the present invention.

DETAILED DESCRIPTION OF THE PREFERRED EMBODIMENTS

Figure 1:
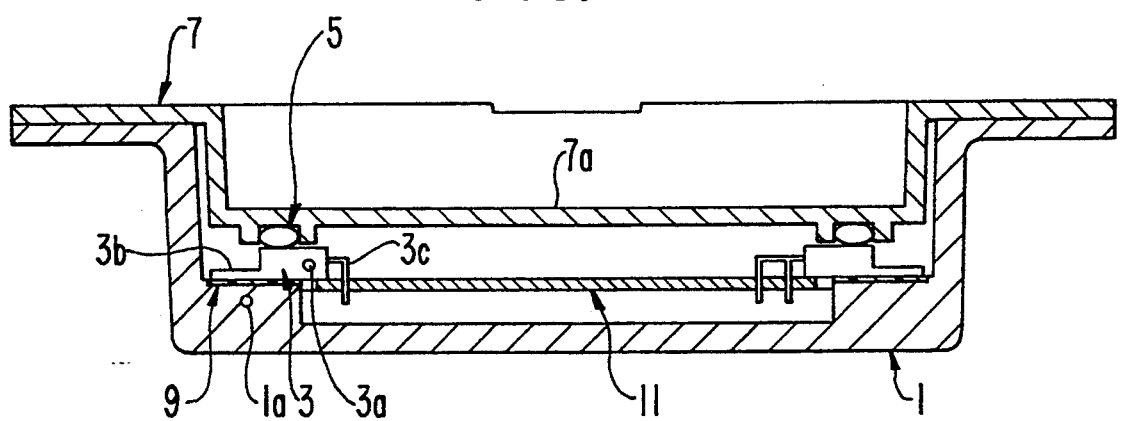
FIG. 1 is a cross section through an assembly utilizing the attachment device of the present invention.
Figure 2:
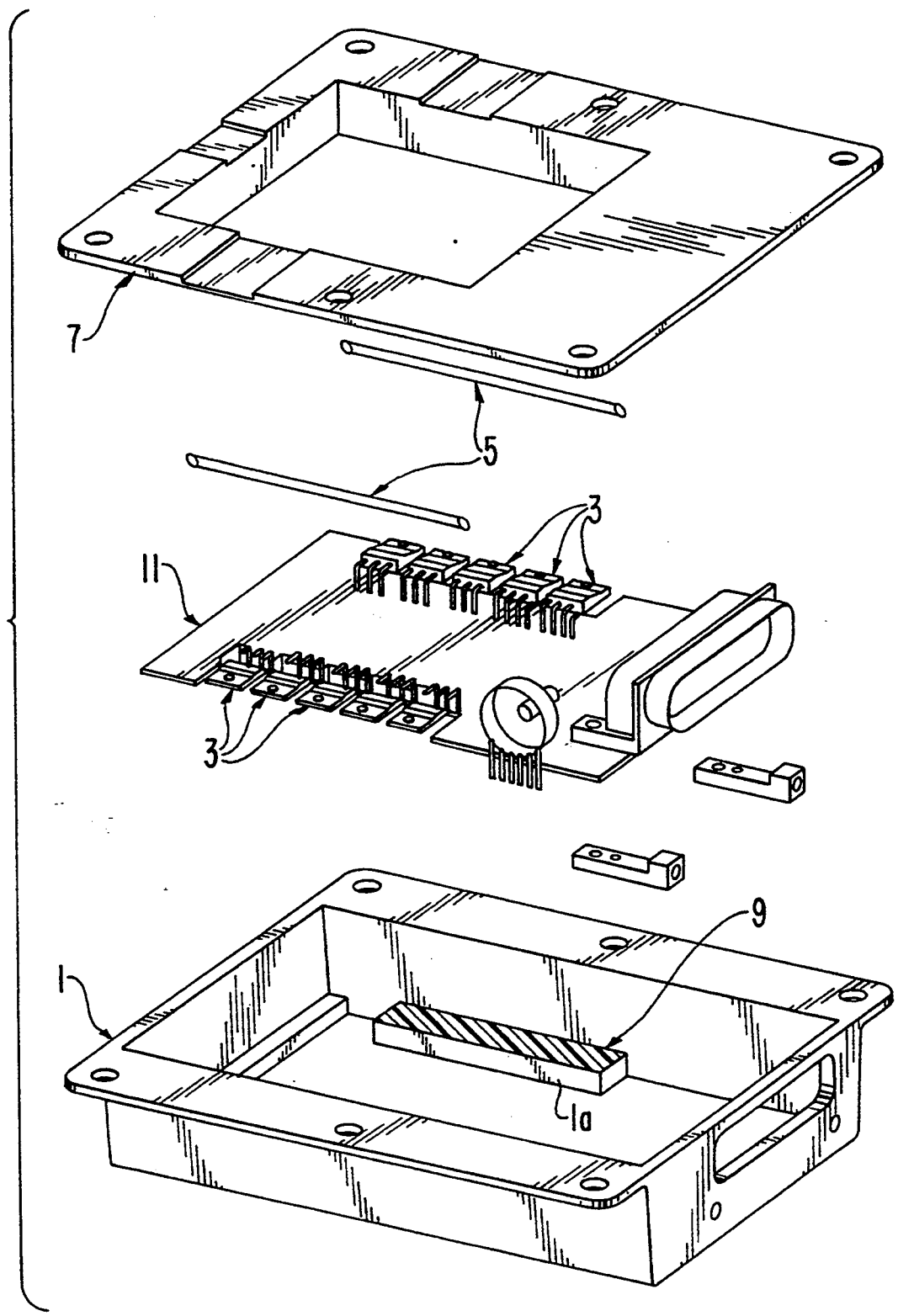
FIG. 2 is an exploded view of the assembly shown in FIG. 1.

FIGS. 1 and 2 show a preferred embodiment of an attachment in accordance with the present invention in which a housing 1 serves as a heat sink for at least one power generating electronic component 3, such as T0220's and leaded D-Paks, that have a body portion 3a from which a heat transfer tab 3b and leads 3c extend. To conduct heat away from the heat generating components, the housing is formed of metal of adequate thermal conductivity, such as aluminum or a copper alloy. Canted coil springs 5 are attached to the underside of a cover 7 for the housing 1 and act to hold the components 3 flush against an electrically insulative, thermally conductive film 9 that has been applied on the top wall surface of a supporting shoulder 1a, when the cover is attached to the housing.

The electrically insulative, thermally conductive film 9 is formed of, for example, polyimide film beneath a layer of boron-nitride filled silicon as is sold by Chomerics Inc. under the trademark CHO-THERM 1680, which will efficiently transfer heat away from mounted components without requiring a high damping pressure. Furthermore the film 9 is preferably adhesive-backed, as is the noted Chomerics product, so that it can be easily mounted to the wall surface of shoulder 1a of housing 1.

The body portion 3a or transfer tab 3b of the electronic component is held against the film 9 by the canted coil springs 5 held against the electronic components with a spring deflection that is within a substantially constant spring force range (e.g., 20–50 psi) of the canted spring when the cover 7 is attached to the housing, despite variations in the assembly tolerances or use of different components. The leads 3c, by which the components 3 are electrically connected to the circuit board 11, are bent or formed to minimize the force required by the springs 5 to move the heat transfer tab 3b or back of the body 3a against the film 9 and to minimize the stresses in the leads after this displacement. In this embodiment, the circuit board is oriented parallel to the bottom wall of housing 1a and top surfaces of its shoulder 1a, so that the electronic components connected to a top side of the circuit board 11 with the leads 3c being bent at a right angle to the circuit board 11, so that the electronic components 3 are pressed on top of the shoulder laterally outwardly of a peripheral edge of the printed wiring board within a notch formed in board 11 that is matched to the shoulder 1a at opposite sides of the circuit board 11.

Figure 3:
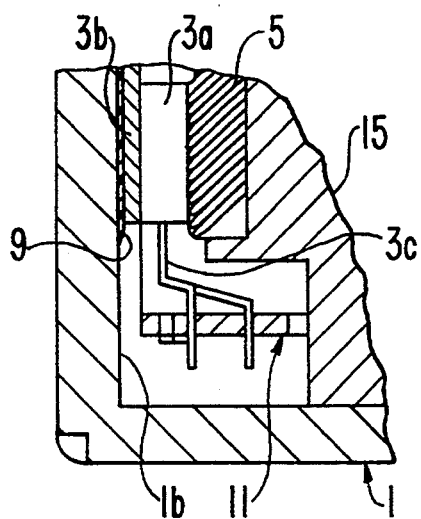
FIG. 3 is a cross-sectional view of a modified assembly utilizing an attachment device in accordance with the present invention.
Figure 4:
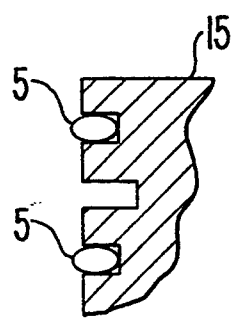
FIG. 4 is a top view of a portion of the FIG. 3 assembly in the area in which the canted coil springs are supported.
Figure 5:
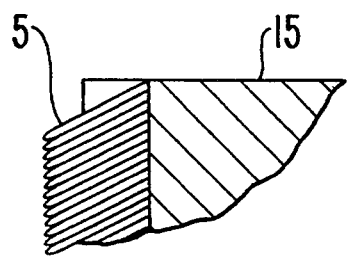
FIG. 5 is a view like that of FIG. 4, but of a modified embodiment.

Alternatively, as shown in the embodiments of FIGS. 3–5, where the row of electronic components 3 are pressed on a side wall 1b of the housing 1, instead of cover 7, an abutment member 15 is utilized to provide the necessary counterbalancing effect. Abutment member 15, preferably, is a plastic supporter fixed to the bottom wall of housing 1.

As shown in FIG. 4, a single canted coil spring 5 can be provided for each electronic component 3, supporting each canted coil spring 5 being supported by the abutment member 15 oriented parallel to the respective electronic component, i.e., vertically. Alternatively, as with the embodiment of FIGS. 1 & 2, as shown in FIG. 5, a single canted coil spring can be provided for a plurality of electronic components, in which case the abutment member supports the canted coil spring 5 oriented parallel to the row of electronic components 3, i.e., horizontally. If electronic components 3 are provided, in the manner shown in FIG. 3, at opposite sides of the housing 1, as is the case shown in FIGS. 1 & 2, a single abutment member 15, substantially spanning the distance between the attachment areas, or a pair of abutment members 15, one for each side, can be fixed to the bottom wall of the housing 1 for supporting and opposing the force of the canted coil springs 5 at each side wall 1b. As shown in FIG. 3, leads 3c, by which the components 3 are electrically connected to the circuit board 11, are bent or formed into a generally S-shaped configuration to minimize the force required by the springs 5 to move the heat transfer tab 3b or back of the body 3a against the film 9 and to minimize the stresses in the leads after this displacement.

While we have shown and described various embodiments in accordance with the present invention, it is understood that the same is not limited thereto, but is susceptible of numerous changes and modifications as known to those skilled in the art. For example, instead of the cover 7 having an inwardly projecting portion 7a which carries the canted coil springs 5, the coil springs 5 could be mounted to spring supports attached to the underside of a flat cover. As such, we do not wish to be limited to the details shown and described herein and intend to cover all such changes and modifications as are encompassed by the scope of the appended claims.

Industrial Applicability

The present invention will find a wide range of application to devices in which various electronic components, which generate amounts of heat which cannot be adequately dissipated without using a heat sink, are enclosed in a housing.

We claim:

1. Electronic component heat sink arrangement comprising a housing formed of a heat sinking material and containing a printed circuit wiring board and a plurality of heat generating electronic components, at least one canted coil spring for pressing the electronic components into a nonelectrically conductive, heat exchange relationship with an inner wall surface of the housing, and means for holding the at least one canted coil spring against the electronic components with a spring deflection that is within a substantially constant spring force range of the at least one canted spring; wherein the means for holding the at least one canted coil spring against the electronic components is formed by a cover for said housing, said at least one canted coil spring being compressed between the electronic components and a portion of the cover which faces said inner wall surface of the housing.

2. Electronic component heat sink arrangement according to claim 1, wherein said canted at least one coil spring is constructed to apply a pressure in a range of 20–50 psi to a full range of differing sizes of electronic components.

3. Electronic component heat sink arrangement according to claim 1, wherein said inner wall surface of the housing is formed by a supporting shoulder provided on a bottom wall of the housing and the canted at least one coil spring presses the electronic components into said heat exchange relationship with a top surface of said supporting shoulder.

4. Electronic component heat sink arrangement according to claim 3, wherein the housing is provided with a pair of supporting shoulders on the bottom wall thereof, a respective canted coil spring pressing a row of said electronic components into said heat exchange relationship with a top surface of each said supporting shoulder.

5. Electronic component heat sink arrangement according to claim 4, wherein the canted coil springs are carrier by the cover.

6. Electronic component heat sink arrangement according to claim 1, wherein the canted at least one coil spring is carrier by the cover.

7. Electronic component heat sink arrangement according to claim 6, wherein the cover has an inwardly projecting portion upon which the canted at least one coil springs is carrier.

8. Electronic component heat sink arrangement according to claim 3, wherein an electrically insulative, thermally conductive film is disposed on the top wall surface of the supporting shoulder, the electronic components being in said nonelectrically conductive, heat exchange relationship with said inner wall surface of the housing via said film.

9. Electronic component heat sink arrangement according to claim 1, wherein an electrically insulative, thermally conductive film is disposed on the said inner wall surface of the housing, the electronic components being in said nonelectrically conductive, heat exchange relationship with said inner wall surface of the housing via said film.

10. Electronic component heat sink arrangement comprising a housing formed of a heat sinking material and containing a printed circuit wiring board and a plurality of heat generating electronic components, at least one canted coil spring for pressing the electronic components into a nonelectrically conductive, heat exchange relationship with an inner wall surface of the housing, and means for holding the at least one canted coil spring against the electronic components with a spring deflection that is within a substantially constant spring force range of the at least one canted spring; wherein said printed wiring board is oriented parallel to said inner wall surface, wherein said electronic components are connected to a top side of said printed wiring board via electrically conductive leads, said leads being bent at a right angle to said printed wiring board and the electronic components being pressed against said inner wall surface laterally outwardly of a peripheral edge of the printed wiring board.

11. Electronic component heat sink arrangement according to claim 10, wherein said inner wall surface is a side wall of the housing.

12. Electronic component heat sink arrangement according to claim 11, wherein the means for holding the at least one canted coil spring against the electronic components is formed by an abutment member in said housing, said at least one canted coil spring being compressed between the electronic components and said abutment member.

13. Electronic component heat sink arrangement according to claim 12, wherein a canted coil spring is provided for each electronic component, the abutment member supporting each canted coil spring oriented parallel to the respective electronic component.

14. Electronic component heat sink arrangement according to claim 12, wherein the abutment member is fixed to the housing.

15. Electronic component heat sink arrangement according to claim 12, wherein a single canted coil spring is provided for a plurality of electronic components, the abutment member supporting the canted coil spring oriented parallel to a row of said electronic components.

16. Electronic component heat sink arrangement according to claim 12, wherein said inner wall surface comprises an inner side wall surface at opposite sides of the housing; and wherein canted coil springs are provided for pressing electrical components against each of the inner side wall surfaces.

17. Electronic component heat sink arrangement according to claim 16, wherein the electrical components have conductive leads by which they are connected to a circuit board, said leads having a generally S-shaped configuration for minimizing the force required by the springs to move the electrical components against said inner wall surfaces and for minimizing the stresses in the leads after the electrical components have been moved against said inner wall surfaces.

18. Electronic component heat sink arrangement according to claim 12, wherein the electrical components have conductive leads by which they are connected to a circuit board, said leads having a generally S-shaped configuration for minimizing the force required by the at least one spring to move the electrical components against said inner wall surfaces and for minimizing the stresses in the leads after the electrical components have been moved against said inner wall surfaces.

* * * * *